US008576567B2

(12) United States Patent  
Katoh et al.

(10) Patent No.: US 8,576,567 B2  
(45) Date of Patent: Nov. 5, 2013

(54) SEMICONDUCTOR DEVICE AND DISPLAY APPARATUS

(75) Inventors: Tatsuya Katoh, Osaka (JP); Takuya Sugiyama, Osaka (JP); Yasunori Chikawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 345 days.

(21) Appl. No.: 12/735,415

(22) PCT Filed: Jan. 13, 2009

(86) PCT No.: PCT/JP2009/050288
§ 371 (c)(1),
(2), (4) Date: Jul. 14, 2010

(87) PCT Pub. No.: WO2009/090931
PCT Pub. Date: Jul. 23, 2009

(65) Prior Publication Data
US 2010/0290192 A1 Nov. 18, 2010

(30) Foreign Application Priority Data

Jan. 17, 2008 (JP) ................................. 2008-008499
Mar. 25, 2008 (JP) ................................. 2008-078759

(51) Int. Cl.
*H05K 7/20* (2006.01)
*H05K 7/00* (2006.01)
*H01L 23/34* (2006.01)
*H01L 23/495* (2006.01)

(52) U.S. Cl.
USPC ........... 361/710; 361/718; 361/723; 361/748; 361/783; 257/675; 257/706; 257/713

(58) Field of Classification Search
USPC ................. 361/707, 710, 718, 723, 748, 783; 257/675, 706, 713
See application file for complete search history.

(56) References Cited

U.S. PATENT DOCUMENTS

| 5,083,191 | A | * | 1/1992 | Ueda | 257/783 |
| 5,357,400 | A | * | 10/1994 | Takekawa | 361/704 |
| 5,552,631 | A | * | 9/1996 | McCormick | 257/666 |
| 5,757,068 | A | * | 5/1998 | Kata et al. | 257/668 |
| 5,874,773 | A | * | 2/1999 | Terada et al. | 257/676 |
| 6,650,002 | B1 | * | 11/2003 | Toyosawa et al. | 257/637 |
| 6,683,448 | B1 | * | 1/2004 | Ohtsuka | 324/117 H |
| 6,759,732 | B1 | * | 7/2004 | Imamura | 257/668 |

(Continued)

FOREIGN PATENT DOCUMENTS

| JP | 9-162344 | | 6/1997 |
| JP | 2000082870 | A * | 3/2000 |
| JP | 2006-108356 | | 4/2006 |
| JP | 2007027682 | A * | 2/2007 |

OTHER PUBLICATIONS

International Search Report.
Written Opinion.

(Continued)

*Primary Examiner* — Bradley Thomas
(74) *Attorney, Agent, or Firm* — Harness, Dickey & Pierce, P.L.C.

(57) ABSTRACT

A COF includes, in at least one embodiment, a heat dissipating material on a back surface of an insulating film. The heat dissipating material has a slit for reducing a degree of thermal expansion. Thus, at least one embodiment of the invention provides the COF in which deformation and disconnection of wiring are prevented.

25 Claims, 7 Drawing Sheets

(56) References Cited

U.S. PATENT DOCUMENTS

| | | | | |
|---|---|---|---|---|
| 6,930,384 B2* | 8/2005 | Kang | | 257/701 |
| 6,953,987 B2* | 10/2005 | Numazaki et al. | | 257/666 |
| 7,420,270 B2* | 9/2008 | Lee et al. | | 257/691 |
| 7,656,089 B2* | 2/2010 | Mo et al. | | 313/582 |
| 7,674,984 B2* | 3/2010 | Kubo | | 174/254 |
| 8,022,306 B2* | 9/2011 | Ebe et al. | | 174/252 |
| 2002/0061609 A1* | 5/2002 | Hashimoto | | 438/131 |
| 2003/0179549 A1* | 9/2003 | Zhong et al. | | 361/707 |
| 2004/0080307 A1* | 4/2004 | Ohtsuka | | 324/117 H |
| 2005/0056915 A1* | 3/2005 | Sumi | | 257/668 |
| 2005/0231925 A1* | 10/2005 | Fukuda et al. | | 361/760 |
| 2005/0258519 A1* | 11/2005 | Kikuchi et al. | | 257/666 |
| 2005/0260391 A1* | 11/2005 | Nakamura et al. | | 428/209 |
| 2006/0071325 A1* | 4/2006 | Tanaka | | 257/712 |
| 2006/0091548 A1* | 5/2006 | Naiki et al. | | 257/753 |
| 2007/0000689 A1* | 1/2007 | Ishimaru et al. | | 174/255 |
| 2007/0013056 A1* | 1/2007 | Lee et al. | | 257/723 |
| 2007/0023876 A1* | 2/2007 | Nakamura et al. | | 257/666 |
| 2007/0108631 A1* | 5/2007 | Nakamura et al. | | 257/784 |
| 2007/0170911 A1* | 7/2007 | Ohsawa et al. | | 324/158.1 |
| 2008/0023822 A1* | 1/2008 | Lee et al. | | 257/702 |
| 2008/0043195 A1* | 2/2008 | Shiki | | 349/150 |
| 2008/0258290 A1* | 10/2008 | Nakajima | | 257/690 |
| 2008/0315437 A1* | 12/2008 | Lee et al. | | 257/778 |
| 2009/0194321 A1* | 8/2009 | Ishimaru et al. | | 174/260 |
| 2009/0195997 A1* | 8/2009 | Ishimaru et al. | | 361/761 |
| 2009/0242506 A1* | 10/2009 | Nakamura et al. | | 216/13 |
| 2009/0277667 A1* | 11/2009 | Ebe et al. | | 174/251 |
| 2011/0044009 A1* | 2/2011 | Fukuda et al. | | 361/720 |

OTHER PUBLICATIONS

Notification Concerning Submission or Transmittal of Priority Document.

PCT Request.

* cited by examiner

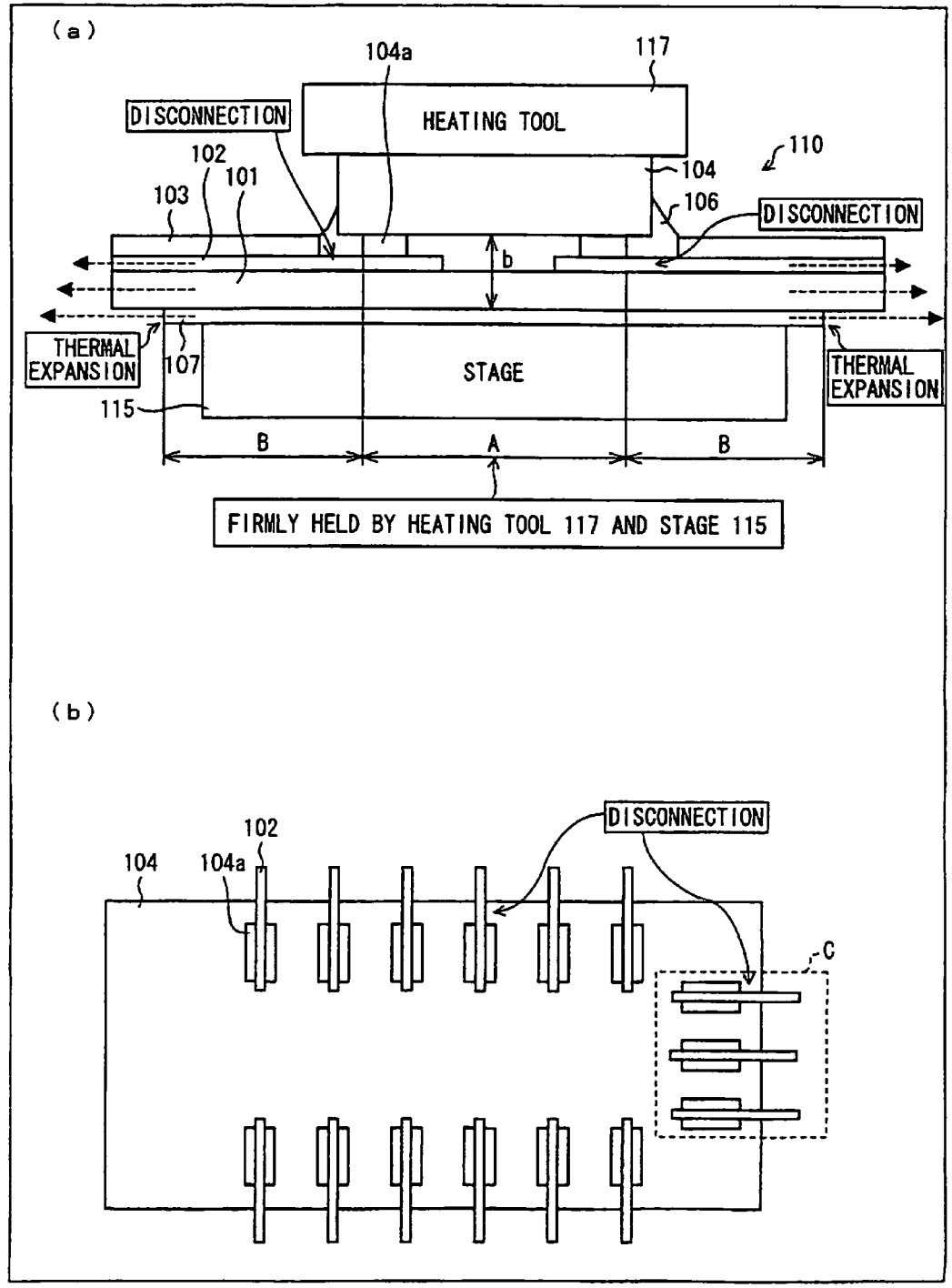

SEMICONDUCTOR DEVICE AND DISPLAY APPARATUS

TECHNICAL FIELD

The present invention relates to: a semiconductor device as a COF (Chip On Film); and a display apparatus including the same. Particularly, the present invention relates to: a semiconductor device in which deformation and disconnection of wiring are prevented; and a display apparatus including the same.

BACKGROUND ART

Conventionally proposed measures for dissipating heat emitted from a semiconductor element in a COF include a technique (see Patent Literature 1) for disposing a metallic heat dissipating material on the whole of or a part of an opposite surface (i.e., a surface opposite to a surface on which a semiconductor element is mounted) of an insulating film of a COF which part corresponds to a region in which the semiconductor element is mounted. The following will briefly describe, with reference to (a) of FIG. 8, a COF employing this technique.

As shown in (a) of FIG. 8, a COF 110, which is a COF employing the above technique, includes: an insulating film 101; wiring 102 disposed on one surface of the insulating film 101; and a solder resist 103 disposed so as to cover a part of the insulating film 101 and a part of the wiring 102. Further, the wiring 102 is bonded with bump electrodes 104a provided on a semiconductor element 104. Furthermore, the COF 110 includes: a sealing resin 106 filled around the semiconductor element 104 so as to fix the semiconductor element 104 to the insulating film 101 and to protect the semiconductor element 104 from water coming from the outside, etc.; and a heat dissipating material 107 (specifically, shaped in a plate and made of copper) disposed on an opposite surface (i.e., a surface opposite to the one surface) of the insulating film 101. The heat dissipating material 107 improves heat dissipation properties of the COF 110 with respect to heat emitted from the semiconductor element 104.

[Patent Literature 1]
Japanese Patent Application Publication, Tokukai, No. 2006-108356 A (Publication Date: Apr. 20, 2006)

SUMMARY OF INVENTION

For the COF 110, in bonding the bump electrodes 104a of the semiconductor element 104 to the wiring 102, as shown in (a) of FIG. 8, the COF 110 is placed on a stage 115 which has been heated to approximately 120° C., and a heating tool 117 which has been heated to approximately 400° C. is placed on the semiconductor element 104 for pressurization. This state is maintained for approximately one second for thermocompression bonding of the bump electrodes 104a to the wiring 102.

At this time, a region of the heat dissipating material 107 which region corresponds to a region "A" in (a) of FIG. 8 is firmly held by the stage 115 and the heating tool 117; however, regions of the heat dissipating material 107 which regions correspond to regions "B" in (a) of FIG. 8 are not held by the stage 115 and the heating tool 117, and accordingly extend in a longer direction (i.e., directions of broken-line arrows in (a) of FIG. 8) due to thermal expansion of the heat dissipating material 107 caused by heat of the stage 115 and the heating tool 117. Consequently, along with the extending of the heat dissipating material 107, the insulating film 101 also extends. This arises a problem of deformation or disconnection of the wiring 102 formed on the insulating film 101.

(b) of FIG. 8 is a plan view illustrating a surface of the semiconductor element 104 on which surface the bump electrodes 104a are provided. As described above, since the heat dissipating material 107 and the insulating film 101 extend in their longer directions, deformation or disconnection of the wiring 102 is outstandingly observed in a shorter side region (a region "C" in (b) of FIG. 8) of the semiconductor element 104.

Note that the cause of this problem is that the heat dissipating material 107 includes a part which cannot be firmly held due to a difference in shape and size between (i) the stage 115 and the heating tool 117 and (ii) the heat dissipating material 107. Therefore, this problem does not occur only in the heat dissipating material 107, shaped in a rectangular as described herein, and the direction in which the heat dissipating material 107 extends is just one example. Furthermore, this phenomenon of the extending of the heat dissipating material 107 can similarly occur during a heating process such as curing of resin after filling of the resin.

The present invention was made in view of the foregoing problem, and an object of the present invention is to provide: a semiconductor device in which deformation and disconnection of wiring are prevented; and a display apparatus including the semiconductor device.

In the present specification, with respect to a rectangular member of a semiconductor device of the present invention, its longer direction is referred to as "lateral", and its shorter side direction is referred to as "vertical".

In order to solve the foregoing problem, a semiconductor device of the present invention includes: an insulating film; wiring provided on a first surface of the insulating film; a semiconductor element provided on the wiring; and a heat dissipating member provided on a second surface of the insulating film which second surface is opposite to the first surface, the heat dissipating member including a first heat dissipating member, and the first heat dissipating member having at least one slit.

According to this configuration, the semiconductor device of the present invention includes the first heat dissipating member having at least one slit. This slit hinders thermal expansion of the first heat dissipating member and reduces a degree thereof, thereby preventing the conventional problem that the wiring is deformed or disconnected due to thermal expansion of the heat dissipating member. Thus, it is possible to provide a semiconductor device in which deformation and disconnection of wiring are prevented. Specifically, for example, in a case where the first heat dissipating member is the one like the above-described heat dissipating material 107 shaped in a rectangular, the at least one slit is provided particularly along a longer direction of the heat dissipating material, in consideration of the function of the at least one slit.

A display apparatus of the present invention includes: the semiconductor device as a display apparatus driving module for driving the display apparatus.

According to this configuration, the display apparatus of the present invention includes, as the display apparatus driving module for driving the display apparatus, the above semiconductor device in which deformation and disconnection of the wiring are prevented. Therefore, it is possible to secure high reliability with respect to operation of the display apparatus of the present invention.

BRIEF DESCRIPTION OF DRAWINGS

FIG. 8 is a view illustrating a COF of conventional art. (a) of FIG. 8 is a cross-section view of the COF, and (b) of FIG. 8 is a plan view illustrating a surface of a semiconductor element on which surface bump electrodes are provided.

REFERENCE SIGNS LIST

1 Insulating Film
1c Punched-Out Region
2 Wiring
3, 3a Solder Resist
4 Semiconductor Element
7 Heat Dissipating Material (First Heat Dissipating Member)
8 Slit
8a Slit (Second Slit)
8b Slit (Third Slit)
8c Slit (First Slit)
8e Slit (Fourth Slit)
8f Slit (Fifth Slit)
8ga, 8gaa Slit (Sixth Slit)
9, 9a, 9b Heat Dissipating Material (Second Heat Dissipating Member)
10, 10a COF (Semiconductor Device) (Display Apparatus Driving Module)
30 Display Apparatus
L1, L2 Center Line

DESCRIPTION OF EMBODIMENTS

[Embodiment 1]

The following will describe an embodiment of the present invention with reference to FIGS. 1 through 5.

Figure 1:
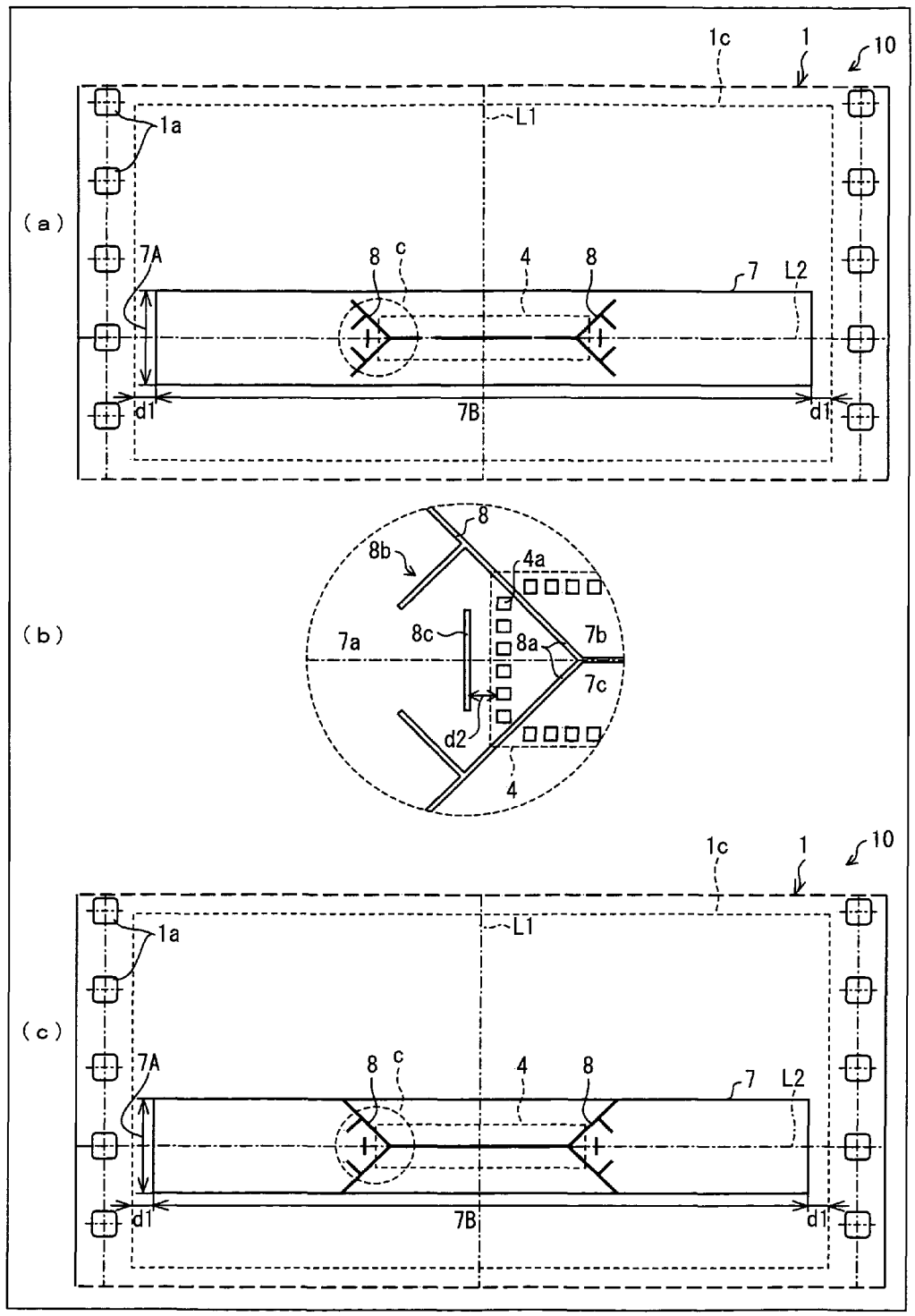
FIG. 1 is a view illustrating a COF of an embodiment of the present invention. (a) and (c) of FIG. 1 are plan views each showing a back surface of the COF. (b) of FIG. 1 is an enlarged view of a region "c" in (a) and (c) of FIG. 1.

FIG. 1 illustrates a COF (semiconductor device) 10 of the present embodiment. (a) and (c) of FIG. 1 are views each illustrating a back surface of the COF 10, and (b) of FIG. 1 is an enlarged view of a region "c" in (a) and (c) of FIG. 1.

The COF 10, having a similar configuration to that of the COF 110 shown in (a) of FIG. 8, includes: an insulating film 1 having a sprocket hole 1a used for mounting of a semiconductor element, etc.; wiring 2 (not illustrated) disposed on one surface of the insulating film 1; and a solder resist 3 (not illustrated) disposed so as to cover a part of the insulating film 1 and a part of the wiring 2. Further, the wiring 2 is bonded with a semiconductor element 4 having bump electrodes 4a via the bump electrodes 4a. Furthermore, the COF 10 includes: a sealing resin 6 (not illustrated) filled around the semiconductor element 4 so as to fix the semiconductor element 4 to the insulating film 1 and to protect the semiconductor element 4 from external effects; and a heat dissipating material (first heat dissipating member) 7 disposed on an opposite surface (a back surface, i.e., a surface opposite to the one surface) of the insulating film 1. The heat dissipating material 7 improves heat dissipation properties of the COF 10 with respect to heat emitted from the semiconductor element 4.

Figure 2:
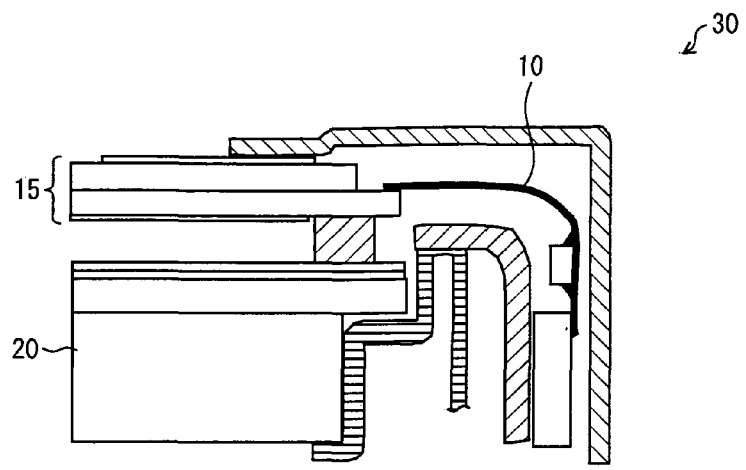
FIG. 2 is a view illustrating a partial configuration of a display apparatus which includes the COF shown in FIG. 1.

FIG. 2 illustrates a partial configuration of a display apparatus 30 which includes the COF 10. Since the display apparatus 30 is a generally-used liquid crystal display apparatus, detailed description thereof is omitted.

The display apparatus 30 includes a display panel 15, a backlight device 20, and the COF 10 serving as a display apparatus driving module for causing the display panel 15 to perform display. As shown in FIG. 2, the COF 10 is bent to be mounted. It is possible to prevent, in the COF 10, deformation and disconnection of the wiring 2 (this will be described in detail later). Since the display apparatus 30 includes the display apparatus driving module constituted by the COF 10 having such the effect, it is possible to secure high reliability with respect to operation of the display apparatus 30. Particularly in a case where the display panel 15 is a large panel with higher functions and multi-output, the above-described effect of securing high reliability is outstanding. Note that the display apparatus 30 is not limited to a liquid crystal display apparatus, and may be a display apparatus employing organic EL, for example.

The following will give a detailed description of the COF 10. Note that detailed descriptions of the insulating film 1, the wiring 2, the solder resist 3, and the sealing resin 6 are omitted here, since they are formed with use of conventionally-known general materials and methods. Mainly described here is the heat dissipating material 7.

The heat dissipating material 7 preferably has a plate-like shape, and is made of a material having a great thermal conductivity in order to achieve excellent heat dissipation properties. Specifically, the heat dissipating material 7 is preferably made of a material having a thermal conductivity of 10 W/(m·K) or more. In other words, the heat dissipating material 7 is preferably made of copper, aluminum, or SUS. A method for making the heat dissipating material 7 is general spattering or the like. In the present embodiment, the heat dissipating material 7 is made of copper. Further, the heat dissipating material 7 preferably has a surface plated or coated with a material different from a material from which the heat dissipating material 7 is made. The heat dissipating material 7, mainly made of metal as described above, may be oxidized. However, the above configuration prevents the heat dissipating material 7 from being oxidized. A specific method for achieving the coating of the surface of the heat dissipating material 7 is tin plating or a solder resist.

Figure 3:
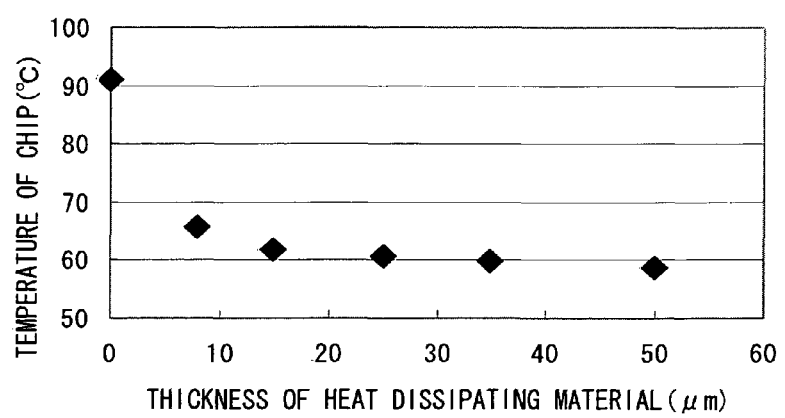
FIG. 3 is a graph illustrating a relationship between a thickness of a heat dissipating material and a temperature of a semiconductor element included in the COF, shown in FIG. 1, which includes the heat dissipating material.

The heat dissipating material 7 preferably has a thickness of 5 μm or more and not more than 30 μm, more preferably 8 μm or more and not more than 15 μm. FIG. 3 is a graph illustrating a relationship between a thickness of the heat dissipating material 7 (horizontal axis) and a temperature of the semiconductor element 4 (vertical axis). This graph shows that the temperature decreases most significantly when the thickness is 8 μm or more and not more than 15 μm, and further increasing the thickness does not enhance the effect so much. Further, also in order that the COF 10 maintains a thin thickness, it is favorable that the heat dissipating material 7 is made to be thin. Therefore, more preferably, the thickness of the heat dissipating material 7 is 8 μm or more and not more than 15 µm. This configuration can improve the heat dissipation properties, while maintaining a thin thickness of the COF 10. In the present embodiment, the heat dissipating material 7 is made to have a thickness of 8 µm or 15 µm.

Figure 5:
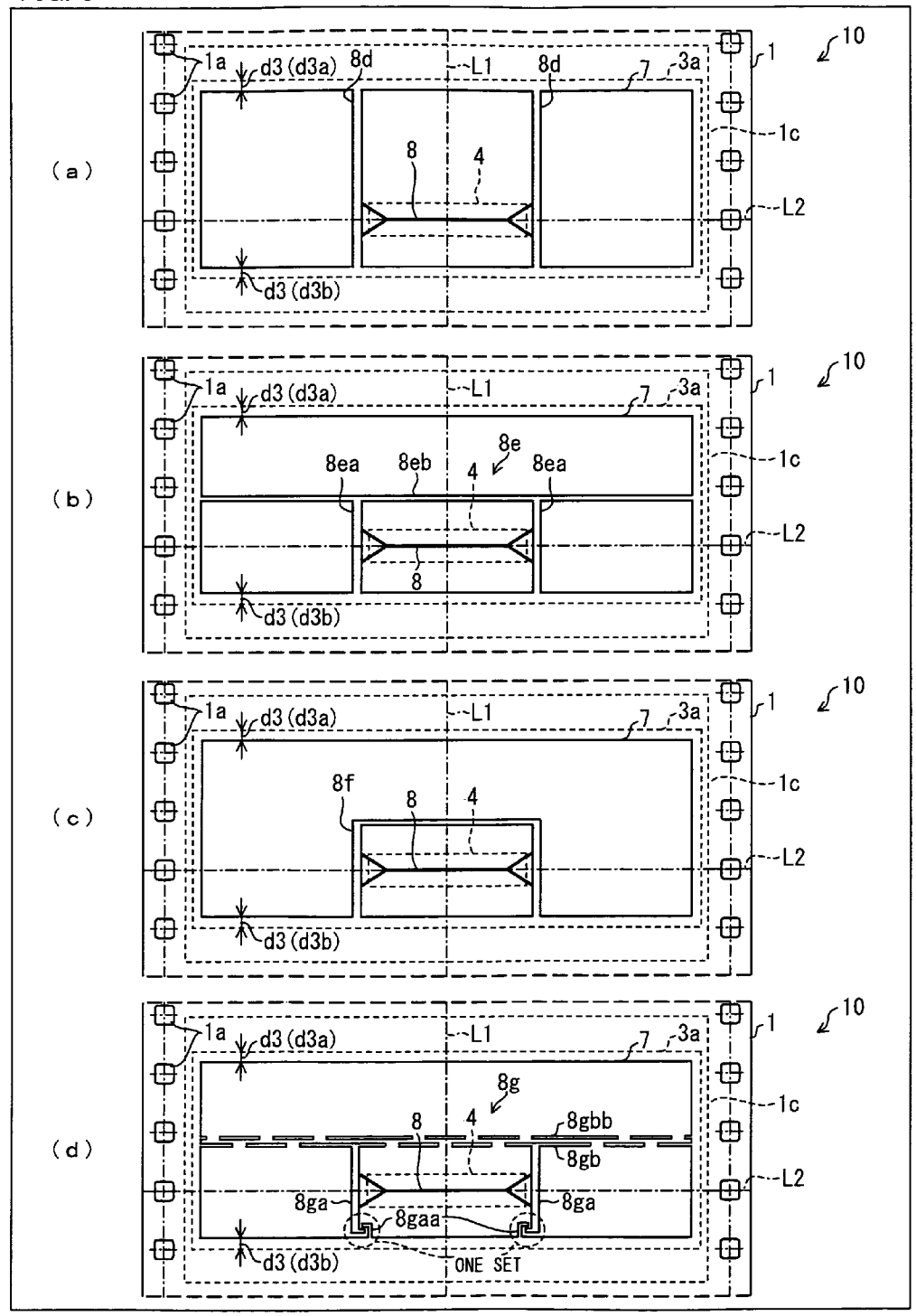
FIG. 5 is a view illustrating further another examples of the slit formed in the COF.

Further, in order that the COF 10 achieves a thin thickness and high heat dissipation properties, it is preferable that the semiconductor element 4 is at a perpendicular distance (a distance "b" shown in (a) of FIG. 5) of not more than 0.1 mm from the heat dissipating material 7.

The heat dissipating material 7 is preferably formed over the whole of the back surface of the COF 10. This configuration provides high heat dissipation properties. However, as described previously, the COF 10 is bent to be mounted; therefore, in consideration of its bending properties, the heat dissipating material 7 is preferably formed in a part of the back surface of the COF 10, specifically, in a region of the back surface of the COF 10 which region corresponds to the semiconductor element 4 and its surrounding.

Specifically, the COF includes a bending inhibited region around the semiconductor element 4 for safety use of a product. In view of this, in the COF 10, the heat dissipating material 7 has a vertical width 7A within a range from a length shorter by 0.5 mm than a vertical width of the bending inhibited region to a length longer by 0.5 mm than the vertical width of the bending inhibited region. In the present embodiment, the heat dissipating material 7 has a vertical width 7A equal to the vertical width of the bending inhibited region. This configuration can improve the heat dissipation properties, while preventing the bending properties from being impaired.

Here, the COF is mounted on the display panel after punching-out of a punched-out region. Therefore, in the COF 10, the heat dissipating material 7 has a lateral width 7B set so that the heat dissipating material 7 has a margin (a region "d1" in (a) of FIG. 1) of at least 0.5 mm from each of both edges of a punched-out region 1c. In the present embodiment, d1=1 mm. This configuration can improve the heat dissipation properties, without causing any trouble in the punching-out during the mounting.

The present embodiment has the heat dissipating material 7 shaped in a rectangular so as to suit the semiconductor element 4 shaped in a rectangular; however, the present invention is not limited to this. Alternatively, for example, the heat dissipating material 7 may be shaped in a square.

Now, as shown in FIG. 1, the heat dissipating material 7 has at least one slit 8, which is a most noteworthy point of the present embodiment. While avoiding a case where a function of the heat dissipating material 7 as the heat dissipating material is impaired, the slit 8 reduces a degree of thermal expansion of the heat dissipating material 7 caused by a heating process (e.g., thermocompression bonding for bonding the bump electrodes 4a of the semiconductor element 4 to the wiring 2 and/or curing of a resin after filling of the resin) so as to prevent extending of the heat dissipating material 7, thereby preventing deformation and disconnection of the wiring 2.

In consideration of the function of the slit 8, it is basically preferable that the slit 8 is provided in a region of the heat dissipating material 7 which region corresponds to the semiconductor element 4 and/or a region of the heat dissipating material 7 which region corresponds to a surrounding of the semiconductor element 4. Further, it is preferable that the slit 8 is formed so as to be symmetric with respect to center lines L1 and L2 (just one example) of the semiconductor element 4. According to this configuration, the slit 8 is provided in the vicinity of the semiconductor element 4. Furthermore, the slit 8 is provided evenly in the vicinity of the semiconductor element 4. This reliably reduces a degree of the thermal expansion, thereby reliably preventing deformation and disconnection of the wiring 2.

Further, the slit 8 preferably includes a first slit which is parallel to a side of the semiconductor element 4. According to this configuration, the first slit is provided so as to run across an expansion path of the heat dissipating material 7. This is quite effective in reducing a degree of the thermal expansion. Consequently, this configuration can more reliably reduce a degree of the thermal expansion, thereby more reliably preventing deformation and disconnection of the wiring 2. Furthermore, it is preferable that the first slit is at a horizontal distance of 0.1 mm or more and not more than 2.0 mm from an end face of a bump provided for one side of the semiconductor element 4, the first slit being closer to the one side than any other side of the semiconductor element 4.

The slit 8 shown in FIG. 1 is formed to deal with the exemplified case where the heat dissipating material 7 extends particularly in its longer direction due to a heating process such as the thermocompression bonding and/or the curing of the resin. The slit 8 includes not only a slit extending in parallel with a longer side of the semiconductor element 4 from a position of the heat dissipating material 7 which position corresponds to a center of the semiconductor element 4, but also slits 8a (second slits) (see (b) of FIG. 1) each of which extends radially and is formed particularly in a region of the heat dissipating material 7 which region corresponds to an edge (of a shorter side) of the semiconductor element 4 and a vicinity thereof. In other words, each of the slits 8a has a fan-like shape spreading toward the edge of the heat dissipating material 7. In still other words, as shown in (b) of FIG. 1, the slit 8 includes slits so as to create, in the heat dissipating material 7, regions "7a", "7b", "7c", and "7d (not illustrated; a region symmetric to the region 7a with respect to the center line L1)" and to cause bump electrodes 4a along one side of the semiconductor element 4 to be included in a corresponding one of the above regions (e.g., bump electrodes 4a along one shorter side of the semiconductor element 4 are included in the region "7a").

Furthermore, each of the slits 8a may be made of two slits which make a right angle with each other, for example. Further, each of the two slits is provided with an additional slit so as to form a slit 8b (third slit) shaped in a square having an opening facing an edge of the heat dissipating material 7.

In addition, the slit 8 shown in FIG. 1 includes a slit 8c (see (b) of FIG. 1) serving as the first slit. The slit 8c is at a horizontal distance ("d2" in (b) of FIG. 1) of 0.5 mm from an end face of a bump provided for a shorter side of the semiconductor element 4, the slit 8c being closer to the shorter side than any other side of the semiconductor element 4. Further, as shown in (a) of FIG. 1, in consideration of the heat dissipation properties and in order that the heat dissipating material 7 is not divided, the slit 8 may be provided in such a manner that slits are aligned with a space therebetween or a slit does not reach an edge of the heat dissipating material 7. Alternatively, as shown in (c) of FIG. 1, the slit 8 may be formed in such a manner that the heat dissipating material 7 is divided.

Further, the slit 8 preferably has a width of 0.02 mm or more and not more than 1.0 mm. According to this configuration, it is possible to form the slit 8 so as to be small. This prevents deformation and disconnection of the wiring, while avoiding impairing of the heat dissipation properties of the heat dissipating material 7. A method for forming the slit 8 is general etching.

Furthermore, the width of the slit 8 may be optionally changed depending on the degree of extending of the heat dissipating material 7. That is, by forming the slit 8 to have a large-width part in a region where the heat dissipating material 7 significantly extends, it is possible to enhance the effect of reduction in a degree of the extending. Further, this configuration may be such that: in a region where the heat dissipating material 7 significantly extends, the slit 8 has a large-width part so as to focus particularly on reduction in a degree of the thermal expansion, while securing the heat dissipation properties; and, in a region where the heat dissipating material 7 does not extends so significantly, the slit 8 has a small-width part so as to focus particularly on the heat dissipation properties, while reducing a degree of the thermal expansion. Thus, it is possible to properly set a balance between (i) reduction in a degree of the thermal expansion and (ii) the heat dissipation properties, depending on the situation.

The above-described positioning and shape of the slit 8 are just one example. The cause of the extension of a heat dissipating material is that the heat dissipating material includes a part which cannot be firmly held due to a difference in shape and size between (i) a device (the stage 115 and the heating tool 117 shown in (a) of FIG. 5) for performing the thermocompression bonding and (ii) the heat dissipating plate (this phenomenon may occur also during a heating process such as curing of resin after filling of the resin). Therefore, such the extension can occur in various ways. Accordingly, various positioning and shapes are possible for a slit for preventing the extension of the heat dissipating plate.

Figure 4:
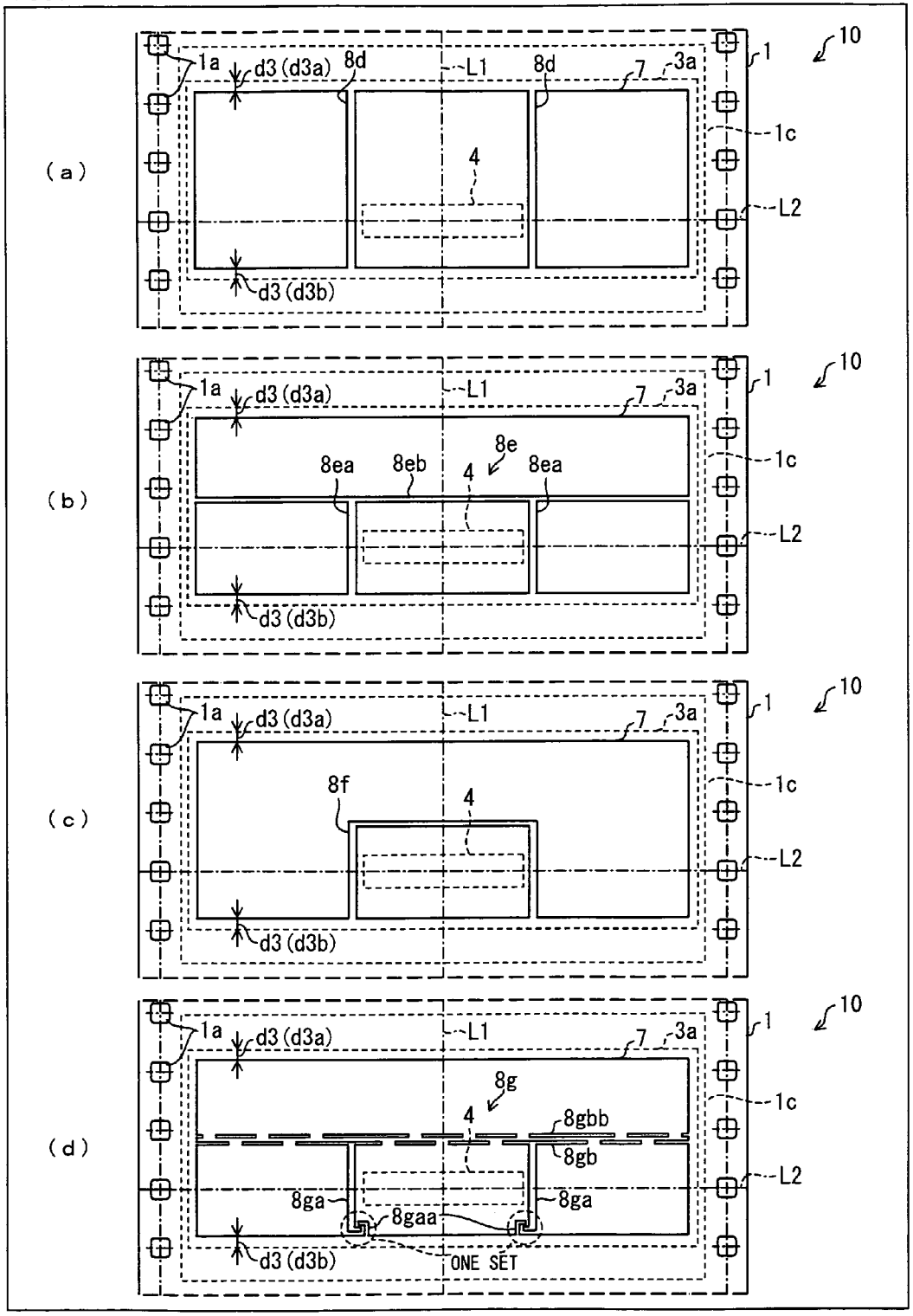
FIG. 4 is a view illustrating another examples of the slit formed in the COF.

Next, the following will describe another example of the slit 8 with reference to FIG. 4. Here, a vertical width 7A of a heat dissipating material 7 is set so that the heat dissipating material 7 has a margin (region "d3" in (a) of FIG. 4) of at least 0.5 mm from each position on an opposite surface (i.e., a surface opposite to a surface on which a solder resist 3 is provided) of an insulating film 1, the each position corresponding to a respective one of both edges of the solder resist 3. In the present embodiment, such a margin ("d3a", "d3b" in FIG. 4) is set to 0.5 mm from each position on an opposite surface (i.e., a surface opposite to a surface on which a solder resist 3 is provided) of the insulating film 1, the each position corresponding to a respective one of both edges ("3a" in FIG. 4) of the solder resist 3.

The slit 8 may be, for example, at least one slit 8d (see (a) of FIG. 4) which is parallel to a shorter side of a semiconductor element 4 and whose both ends reach respective edges (of longer sides) of the heat dissipating material 7. Alternatively, the slit 8 may be a slit (fourth slit) 8e (see (b) of FIG. 4) in which at least two slits, positioned at a distance from each other, are combined and joined together. One of the at least two slits is a slit 8ea (first slit section) which is parallel to a shorter side of a semiconductor element 4 and whose one end reaches an edge (of a longer side) of the heat dissipating material 7, and the other of the at least two slits is a slit (second slit section) 8eb which is parallel to a longer side of the semiconductor element 4 and whose both ends reach respective edges (of shorter sides) of the heat dissipating material 7. Further alternatively, the slit 8 may be a slit (fifth slit) 8f (see (c) of FIG. 4), which is a variation of the slit 8e. In the slit 8f, slits 8ea and 8eb joined together are arranged along a circumference of a semiconductor element 4.

Still further alternatively, the slit 8 may be a slit 8g (see (d) of FIG. 4), which is another variation of the slit 8e. Firstly, the slit 8g includes a slit (sixth slit) 8ga formed by bending a slit 8ea so that the slit 8ea has an L-shape constituted by a shorter part and a longer part, the shorter part being an end portion of the slit 8ea (the slit 8ga does not reach any edge of a heat dissipating material 7). Further, a plurality of slits 8ga, each configured as above, are provided (in the present embodiment, another slit referred to as a slit 8gaa is provided). Furthermore, one of such the slits 8ga and one of such the slits 8gaa are grouped into one set, and a plurality of such sets are arranged at a distance from one another.

End portions of a slit 8ga (one sixth slit) and a slit 8gaa (the other sixth slit) in one of those sets are disposed so that: (i) one end portion, which is a shorter part of an L-shape, of the slit 8ga is parallel to one end portion, which is a shorter part of an L-shape, of the slit 8gaa; and (ii) the other end portion, which is a longer part of the L-shape, of the slit 8ga is parallel to the other end portion, which is a longer part of the L-shape, of the slit 8gaa. Further, the slit 8g includes a slit 8gb, which is a slit 8eb including slits aligned with a space therebetween. Furthermore, the slit 8g includes another slit 8gb (referred to as a slit 8gbb) arranged in parallel with the slit 8gb and at a distance from the slit 8gb so that the slit 8gbb is not in contact with the slit 8gb (i.e., the slit 8gbb is not in contact with the slit 8ga, either). Such the slit 8g has the following advantage: If the heat dissipating material 7 extends or shrinks due to heating, the slits 8ga and 8gaa, each forming the L-shape, function as a spring so as to suppress the extending or shrinking of the heat dissipating material 7. Note that an arrangement of the respective L-shapes constituted by the slits 8ga and 8gaa of the slit 8g is not limited to the arrangement described above. Alternatively, for example, the respective L-shapes of the slits 8ga and 8gaa may be arranged upside down.

A width of each of the slits 8d to 8f is set so as to deal with the above-described exemplified case where the heat dissipating material 7 significantly extends in its longer direction. Specifically, a width of each of the slits 8d to 8f in the longer direction of the heat dissipating material 7 is large, i.e., each of the slits 8d to 8f has a large-width part along a shorter side of the semiconductor element 4. On the other hand, a width of each of the slits 8d to 8f in the shorter direction of the heat dissipating material 7, in which direction the heat dissipating material 7 does not extend so significantly, is small, i.e., each of the slits 8d to 8f has a small-width part along a longer side of the semiconductor element 4. As described above, such the configuration makes it possible to suitably set a balance between (i) reduction in a degree of thermal expansion of a heat dissipating material and (ii) the heat dissipation properties of the heat dissipating material. Further, each of the slits 8d to 8f is provided in a surrounding of the semiconductor element 4, i.e., in a region outside the semiconductor element 4. This configuration particularly allows the function of the heat dissipating material 7 for preventing the thermal expansion to work effectively, thereby enhancing the effect of reduction in a degree of the thermal expansion.

Further, as shown in (a) to (d) of FIG. 5, the slit 8 may include any combination of the above-described slits. (a) to (d) of FIG. 5 respectively show cases where the slits 8d to 8f are combined with the slit 8 shown in FIG. 1.

[Embodiment 2]

Figure 6:
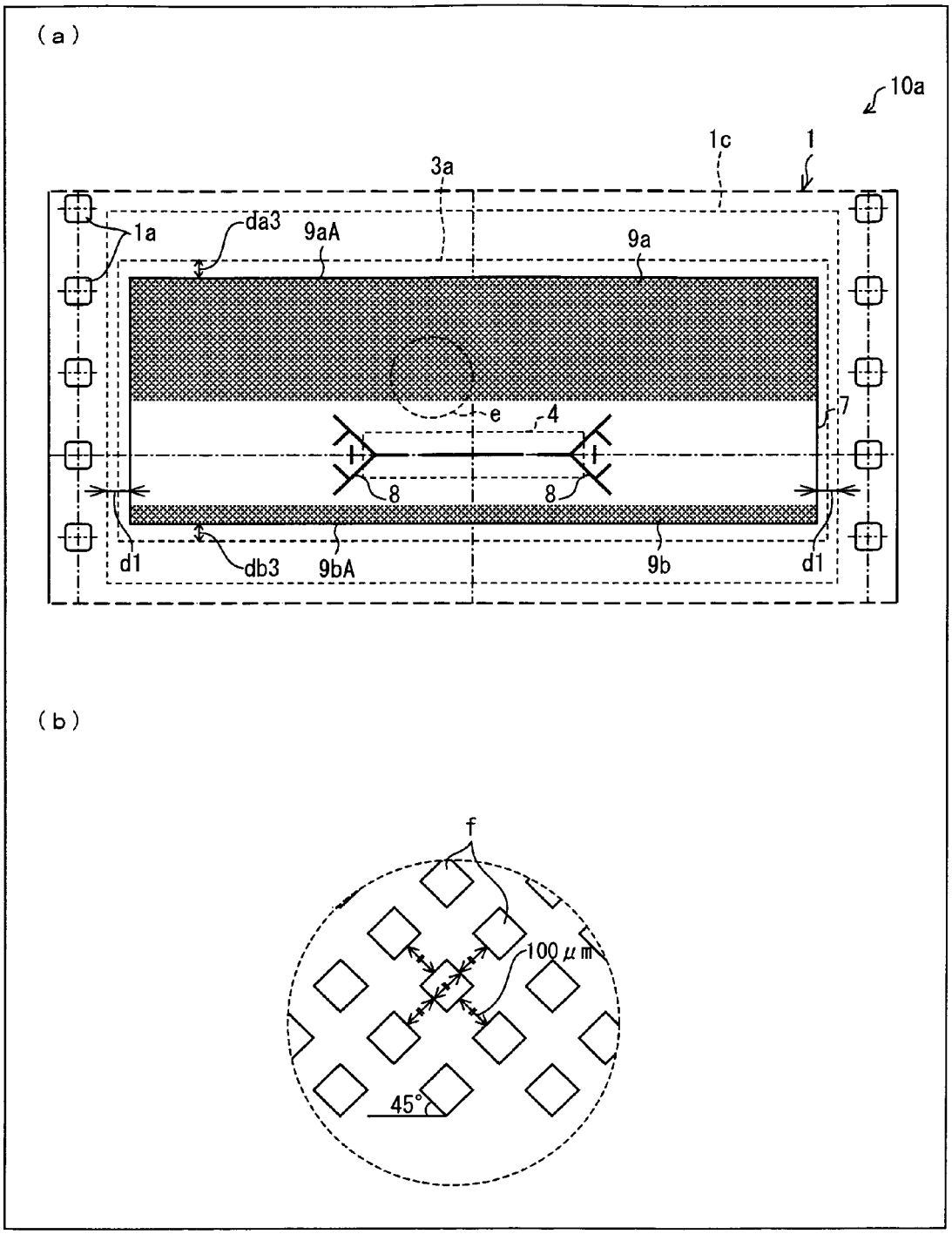
FIG. 6 is a view illustrating a COF of another embodiment of the present invention. (a) of FIG. 6 is a plan view illustrating a back surface of the COF, and (b) of FIG. 6 is an enlarged view of a region "e" in (a) of FIG. 6.

The following will describe another embodiment of the present invention with reference to FIG. 6.

FIG. 6 illustrates a COF (semiconductor device) 10a of the present embodiment. (a) of FIG. 6 is a view illustrating a back surface of the COF 10a, and (b) of FIG. 6 is an enlarged view of a region "e" in (a) of FIG. 6. For convenience of explanation, members having the same functions as those of the COF 10 are given the same signs as the COF 10 and explanations thereof are omitted here. Basically, the description here deals with only differences between the COF 10a and the COF 10.

In addition to the configuration of the COF 10, the COF 10a includes a heat dissipating material (second heat dissipating member) 9 constituted by heat dissipating materials 9a and 9b. The heat dissipating materials 9a and 9b are disposed along respective longer sides of a heat dissipating material 7 so as to be in contact with the heat dissipating material 7. The heat dissipating material 9 may be formed so as to have a similar configuration (e.g., a material, a thickness, a range thereof) to that of the heat dissipating material 7; however, the heat dissipating material 9 is different in shape from the heat dissipating material 7.

As shown in (b) of FIG. 6, the heat dissipating material 9 includes a plurality of openings f each shaped in a square. The openings f are arranged in rows and columns, while each of the plurality of openings f keeps a certain distance from its adjacent opening f. Each of the openings f is a hole penetrating through the heat dissipating material 9 to the insulating film 1. It is preferable that one side of each of the openings f is 50 μm or more and not more than 200 μm, and that the openings f are arranged so that each of the openings f keeps a distance of 50 μm or more and not more than 200 μm from its adjacent opening f. Further, it is preferable that the openings f are arranged so that one side of each of the openings f is parallel to a line making an angle of 35° or more and not more than 55° with respect to a longer side of the heat dissipating material 9. In the present embodiment, one side of each of the openings f is set to 100 μm, a distance from one opening f to its adjacent opening f is set to 100 μm, and the above angle is set to 45°.

It is preferable that the heat dissipating material 9 has a lateral width which is set so as to be equal to a lateral width of the heat dissipating material 7. Further, it is preferable that the heat dissipating material 9 is positioned so that each of its vertical edges is on an inner side of, and at a distance of at least 0.5 mm from a corresponding one of positions on an opposite surface (i.e., a surface opposite to a surface on which a solder resist 3 is provided) of an insulating film 1, the positions respectively corresponding to edges of the solder resist 3. In the present embodiment, the heat dissipating material 9 has a lateral width which is set so as to be equal to a lateral width 7B of the heat dissipating material 7, and the heat dissipating material 9 is positioned so that each of its vertical edge (9aA, 9bA) is at a distance of 0.5 mm ("da3", "db3" of (a) of FIG. 6) from a corresponding one of positions on an opposite surface (i.e., a surface opposite to a surface on which a solder resist 3 is provided) of an insulating film 1, the positions respectively corresponding to edges ("3a" in (a) of FIG. 6) of the solder resist 3. Such the heat dissipating material 9 is formed by means of general sputtering, photolithography, etching, etc., at the same time as forming of the heat dissipating material 7.

According to the above configuration, it is possible for the COF 10a to have a larger heat dissipating material than the COF 10. Further, the heat dissipating material 9, having the openings f, is easier to be bent than the heat dissipating material 7, the whole of which is a heat dissipating material. That is, in comparison with the COF 10, the COF 10a can further improve the heat dissipation properties, while securing the bending properties. Further, by arranging the openings f of the heat dissipating material 9 so that they tilt at the above-described angle, it is possible to suppress extending of the heat dissipating material 9 caused by thermal expansion thereof.

Note that the heat dissipating material 9 is not limited to the above configuration. Alternatively, the openings f may be each shaped in a circle. This provides the same effects as those given by the openings f shaped in a square. In the case where the openings f are each shaped in a circle, it is preferable that each of the openings has a diameter of 50 μm or more and not more than 200 μm, and that the openings are arranged so that each of the openings is at a distance of 50 μm or more and not more than 200 μm from its adjacent opening.

[Embodiment 3]

Figure 7:
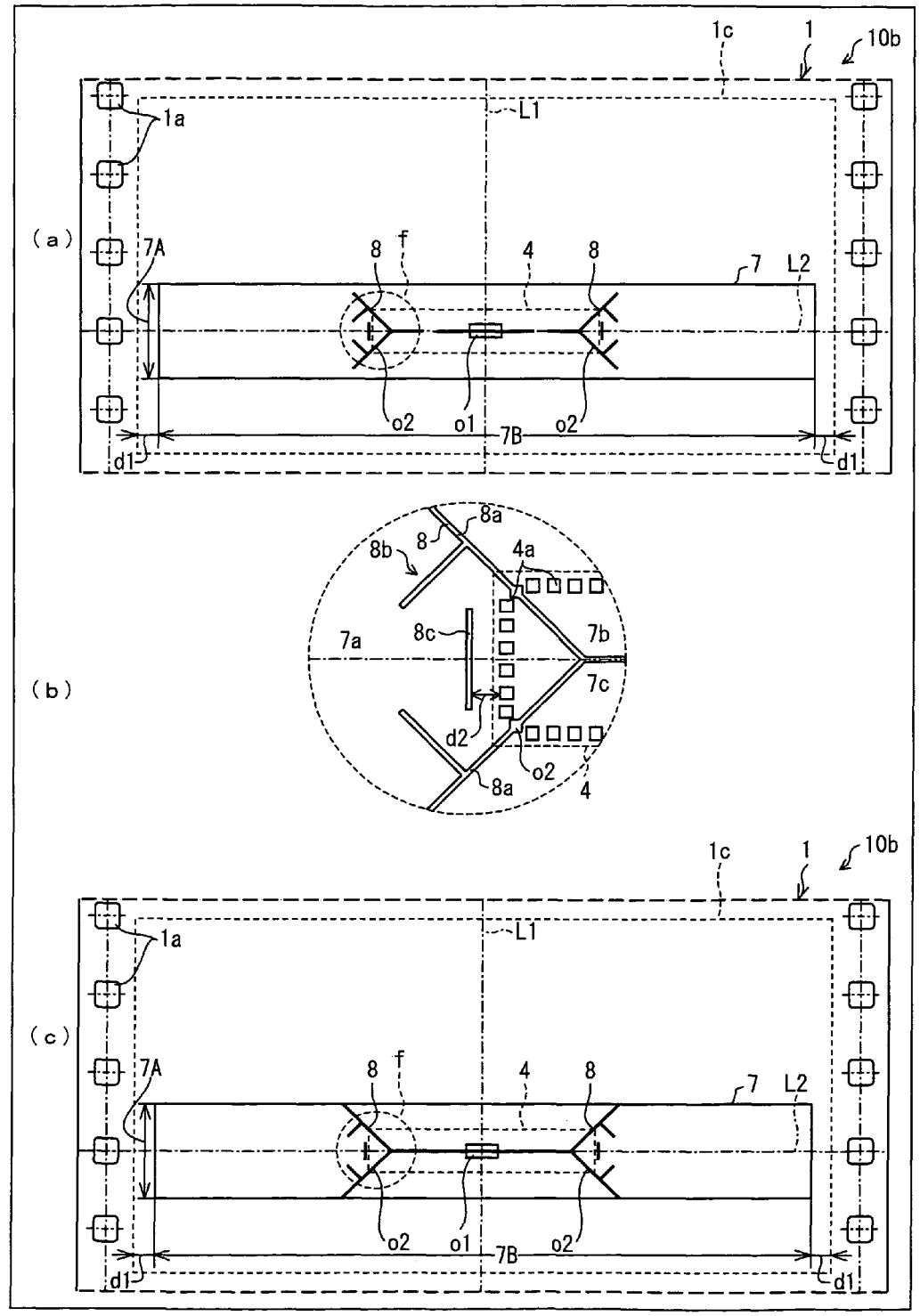
FIG. 7 is a view illustrating a COF of further another embodiment of the present invention. (a) and (c) of FIG. 7 are plan views each illustrating a back surface of the COF, and (b) of FIG. 7 is an enlarged view of a region "f" in (a) and (c) of FIG. 7.

The following will describe further another embodiment of the present invention with reference to FIG. 7.

FIG. 7 illustrates a COF (semiconductor device) 10b of the present embodiment. (a) and (c) of FIG. 7 are views each illustrating a back surface of the COF 10b, and (b) of FIG. 7 is an enlarged view of a region "f" in (a) and (c) of FIG. 7. For convenience of explanation, members having the same functions as those of the COF are given the same signs as the COF 10, and explanations thereof are omitted here. Basically, the description here deals with only differences between the COF 10b and the COF 10.

For quality control and production process control for a COF, the following items, for example, are checked from a back surface of a transparent insulating film after the COF is produced: (1) whether or not bump electrodes of a semiconductor element are bonded to wiring without misalignment, and whether or not the bonding quality is fine; and (2) whether or not a sealing resin is properly filled. However, since conventional COFs and the COF 10 each include an insulating film on which a heat dissipating material is disposed, it is impossible to perform the above checks. An object of the present embodiment is to solve this problem.

The COF 10b of the present embodiment has basically the same configuration as that of the COF 10. The COF 10b has (i) an opening o1 at a position corresponding to a center of a semiconductor element 4 and (ii) openings o2 at positions corresponding to respective alignment marks of the semiconductor element 4. Each of the openings o1 and o2 is a hole penetrating through a heat dissipating material 7 to an insulating film 1. The opening o1 makes it possible to check, via the transparent insulating film 1, if a sealing resin 6 is properly filled. Further, through the opening o1, a thermocouple can be brought into contact with the semiconductor element 4 for measurement of a temperature of the semiconductor element 4. Furthermore, through the openings o2, it is possible to observe the alignment marks of the semiconductor element 4. This makes it possible to check if the semiconductor element 4 is appropriately positioned. Thus, by providing the openings o1 and o2 to the heat dissipating material 7, it is possible to perform the quality control and the production procedure control. In the present embodiment, the heat dissipating material 7 has both of the openings o1 and o2. However, this configuration is just one example. Alternatively, the heat dissipating material 7 may have either the opening o1 or the opening o2.

It is preferable that the opening o1 has a vertical width o1A smaller by at least 0.1 mm than a vertical width of the semiconductor element 4, and has a lateral width o1B smaller by at least 0.1 mm than a lateral width of the semiconductor element 4. Further, it is preferable that the openings o2 each have a vertical width of 0.05 mm or more and not more than 0.15 mm, and a lateral width of 0.05 mm or more and not more than 0.15 mm. In the present embodiment, the opening o1 has a vertical width o1A of 0.8 mm, and has a lateral width o1B of 2.0 mm. Further, the openings o2 are each shaped in a square whose one side is 116 um. Each of the openings o2 is set to this size to suit a size, 96 um, of the alignment mark of the semiconductor element 4. Each of the openings o2 is set so that such the alignment mark secures a margin of 10 um in four directions, up, down, left, and right, from the opening o2. The openings o1 and o2 are formed by general etching or the like.

In the present embodiment, the opening o1 is shaped in a rectangular. However, the present invention is not limited to this. Alternatively, for example, the opening o1 may be shaped in a square. The opening o2 is also not limited to any specific shape. However, in view of alignment accuracy, the opening o2 is preferably shaped in a square as in the present embodiment.

The present invention is not limited to the description of the embodiments above, but may be altered by a skilled person within the scope of the claims. An embodiment based on a proper combination of technical means disclosed in different embodiments is encompassed in the technical scope of the present invention.

In a semiconductor device of the present embodiment, the at least one slit may be provided in a region of the first heat dissipating member which region corresponds to the semiconductor element and/or a region of the first heat dissipating member which region corresponds to a surrounding of the semiconductor element.

According to this configuration, the slit is provided in the vicinity of the semiconductor element. This makes it possible to reliably reduce a degree of the thermal expansion, thereby reliably preventing deformation and disconnection of the wiring.

In the semiconductor device of the present embodiment, the at least one slit may include one or more first slits each of which is parallel to a side of the semiconductor element.

According to this configuration, the first slit is provided so as to run across a thermal expansion path of the first heat dissipating member. This is quite effective in reducing a degree of the thermal expansion. Consequently, this configuration can more reliably reduce a degree of the thermal expansion, thereby more reliably preventing deformation and disconnection of the wiring.

In the semiconductor device of the present embodiment, the at least one slit may include at least one second slit provided in a region of the first heat dissipating member which region corresponds to an edge of the semiconductor element and a vicinity of the edge, said at least one second slit having a fan-like shape spreading toward an edge of the first heat dissipating member.

In the semiconductor device of the present embodiment, the at least one second slit may be made of two slits which make a right angle with each other, each of the two slits being provided with an additional slit so as to form a third slit shaped in a square having an opening facing the edge of the first heat dissipating member.

In the semiconductor device of the present embodiment, the at least one slit may include a fourth slit in which at least one first slit section and at least one second slit section are combined and joined together, said at least one first slit section being one of the one or more first slits parallel to a side of the semiconductor element in one direction, and said at least one second slit section being another one of the one or more first slits parallel to a side of the semiconductor element in the other direction.

In the semiconductor device of the present embodiment, the at least one slit may include a fifth slit disposed along a circumference of the semiconductor element.

In the semiconductor device of the present embodiment, the at least one slit may include at least two sixth slits disposed at a distance from each other, each of said at least two sixth slits being formed by bending one of the one or more first slits so that the one of the one or more first slits has an L-shape constituted by a shorter part and a longer part, the shorter part being an end portion of the one of the one or more first slits; and in a case where two of said at least two sixth slits, disposed at distance from each other, are grouped into one set, end portions of the two sixth slits in the one set may be disposed so that (i) one end portion, which is a shorter part of an L-shape, of one of the two sixth slits is parallel to one end portion, which is a shorter part of an L-shape, of the other of the two sixth slits and (ii) the other end portion, which is a longer part of the L-shape, of the one of the two sixth slits is parallel to the other end portion, which is a longer part of the L-shape, of the other of the two sixth slits.

With the above configuration, if the first heat dissipating member extends or shrinks due to heating, the L-shape parts function as a spring so as to suppress the extending or shrinking of the first heat dissipating member.

In the semiconductor device of the present embodiment, the at least one slit may be positioned in such a manner that slits are aligned with a space therebetween or a slit does not reach an edge of the first heat dissipating member in order that the first heat dissipating member is not divided.

According to this configuration, the first heat dissipating member is not divided. This makes it possible to secure the heat dissipation properties.

In the semiconductor device of the present embodiment, the at least one slit may be formed so as to be symmetric with respect to a center line of the semiconductor element.

In the semiconductor device of the present embodiment, each of the one or more first slits may be at a horizontal distance of 0.1 mm or more and not more than 2.0 mm from an end face of a bump provided for one side of the semiconductor element, said each of the one or more first slits being closer to the one side than any other side of the semiconductor element.

In the semiconductor device of the present embodiment, the at least one slit may have a large-width part in a region where the first heat dissipating member thermally expands to a large degree, and the at least one slit may have a small-width part in a region where the first heat dissipating member thermally expands to a small degree.

According to this configuration, the slit has a large-width part in a region where the first heat dissipating member thermally expands to a large extent. Therefore, it is possible to enhance the effect of reduction in a degree of the thermal expansion, thereby more reliably preventing deformation and disconnection of the wiring. Further, according to this configuration, (i) the slit has a large-width part in a region where the first heat dissipating member thermally expands to a large degree so as to focus particularly on reduction in a degree of the thermal expansion, while securing the heat dissipation properties, and (ii) the slit has a small-width part in a region where the first heat dissipating member thermally expands to a small degree so as to focus particularly on the heat dissipation properties, while reducing a degree of the thermal expansion. Thus, it is possible to properly set a balance between (i) reduction in a degree of the thermal expansion and (ii) the heat dissipation properties, depending on the situation.

In the semiconductor device of the present embodiment, the first heat dissipating member may have a vertical width set so that the first heat dissipating member is positioned on an inner side of a punched-out region of the semiconductor device, and at a distance of at least 0.5 mm from each of both vertical edges of the punched-out region.

In the semiconductor device of the present embodiment, the first heat dissipating member may be provided only in a region of the second surface of the insulating film which region corresponds to the semiconductor element and the surrounding of the semiconductor element.

With this configuration, it is possible to secure the bending properties in bending the semiconductor device for mounting, while maintaining the heat dissipation properties of the semiconductor device.

In the semiconductor device of the present embodiment, a second heat dissipating member may be further provided in a surrounding of the first heat dissipating member so as to be in contact with the first heat dissipating member; the second heat dissipating member may have a plurality of openings, each shaped in a square or a circle, each of which is a hole penetrating through the second heat dissipating member to the insulating film; and the plurality of openings may be arranged in rows and columns, while each of the plurality of openings keeps a certain distance from its adjacent opening of the plurality of openings.

Specifically, it is preferable that: in a case where the plurality of openings of the second heat dissipating member are each shaped in a square, one side of each of the plurality of openings is 50 μm or more and not more than 200 μm, and the plurality of openings are arranged so that each of the plurality of openings keeps a distance of 50 μm or more and not more than 200 μm from its adjacent opening of the plurality of openings; and in a case where the plurality of openings of the second heat dissipating member are each shaped in a circle, a diameter of each of the plurality of openings is 50 μm or more and not more than 200 μm, and the plurality of openings are arranged so that each of the plurality of openings keeps a distance of 50 μm or more and not more than 200 μm from its adjacent opening of the plurality of openings.

Further, in the case where the plurality of openings of the second heat dissipating member are each shaped in a square, the plurality of openings may be arranged so that one side of each of the plurality of openings is parallel to a line making an angle of 35° or more and not more than 55° with respect to a lateral side of the second heat dissipating member; and in the case where the plurality of openings of the second heat dissipating member are each shaped in a circle, the plurality of openings may be arranged in respective positions corresponding to positions at which, in the case where the plurality of openings of the second heat dissipating member are each shaped in a square, the plurality of openings each shaped in a square are to be provided.

According to this configuration, it is possible for the semiconductor device to have a larger heat dissipating member than the semiconductor device including only the first heat dissipating member as a heat dissipating member. Thus, this configuration can further improve the heat dissipation properties of the semiconductor device. Further, according to this configuration, the second heat dissipating member has the openings. That is, a heat dissipating member is not provided over the whole of the second heat dissipating member. Therefore, the second heat dissipating member is easy to be bent. That is, this configuration can further improve the heat dissipation properties of the semiconductor device, while securing the bending properties.

Furthermore, by arranging the openings of the second heat dissipating member so that they tilt at the above-described angle, it is possible to suppress extending of the second heat dissipating member caused by thermal expansion thereof.

The semiconductor device of the present embodiment may further include a resist provided so as to cover a part of the insulating film and a part of the wiring, the second heat dissipating member having a lateral width which is equal to a lateral width of the first heat dissipating member, and the second heat dissipating member being positioned so that each of its vertical edges is on an inner side of, and at a distance of at least 0.5 mm from a corresponding one of positions on the second surface of the insulating film, the positions respectively corresponding to edges of the resist.

The semiconductor device of the present embodiment may further include a bending inhibited region where bending of the semiconductor device is inhibited while the semiconductor device is bent for use, the first heat dissipating member having a vertical width within a range from a length shorter by 0.5 mm than a vertical width of the bending inhibited region to a length longer by 0.5 mm than the vertical width of the bending inhibited region.

According to this configuration, the vertical width of the first heat dissipating member is set so as to be substantially equal to that of the bending prohibited region. This makes it possible to secure maximum bending properties, while maintaining the heat dissipation properties of the semiconductor device.

In the semiconductor device of the present embodiment, the first heat dissipating member may have a lateral width set so that the first heat dissipating member is at a distance of at least 0.5 mm from each of both lateral edges of a punched-out region of the semiconductor device.

With this configuration, it is possible to improve the heat dissipation properties of the semiconductor device, without causing any trouble in punching-out during mounting.

The semiconductor device of the present embodiment includes the at least one slit including a first slit which is parallel to a side of the semiconductor element, the first slit is at a horizontal distance of 0.1 mm or more and not more than 2.0 mm from an end face of a bump provided for one side of the semiconductor element, the first slit being closer to the one side than any other side of the semiconductor element.

In the semiconductor device of the present embodiment, the first heat dissipating member or the heat dissipating member may be made of a material having a thermal conductivity of 10 W/(m·K) or more.

In the semiconductor device of the present embodiment, the first heat dissipating member or the heat dissipating member may be made of copper, aluminum, or SUS.

According to this configuration, the first heat dissipating member and/or the second heat dissipating member is made of a material having a high thermal conductivity. This provides excellent heat dissipation properties.

In the semiconductor device of the present embodiment, the first heat dissipating member or the heat dissipating member may have a thickness of 5 μm or more and not more than 30 μm.

With this configuration, it is possible to improve the heat dissipation properties, while maintaining a thin thickness of the semiconductor device.

In the semiconductor device of the present embodiment, it is preferable that the first heat dissipating member or the heat dissipating member has a surface plated or coated with a material different from a material from which the first heat dissipating member or the heat dissipating member is made.

The hear dissipating member, mainly made of metal, may be oxidized. However, the above configuration can prevent the heat dissipating member from being oxidized.

In the semiconductor device of the present embodiment, the at least one slit provided in the first heat dissipating member may have a width of 0.02 mm or more and not more than 1.0 mm.

According to this configuration, the slit is formed to be small. This makes is possible to prevent deformation and disconnection of the wiring, while avoiding impairing of the heat dissipation properties of the semiconductor device.

In the semiconductor device of the present embodiment, the semiconductor element may be at a perpendicular distance of not more than 0.1 mm from the heat dissipating member.

With this configuration, it is possible to make the semiconductor device thin, and to dispose each heat dissipating member in the vicinity of a heat source. This makes it possible to improve the heat dissipation properties of the semiconductor device.

INDUSTRIAL APPLICABILITY

The present invention is suitably applicable to a COF including a heat dissipating material disposed on a back surface of the COF. The present invention can reduce a degree of thermal expansion of the heat dissipating material, thereby preventing deformation and disconnection of wiring.

The invention claimed is:

1. A semiconductor device, comprising:
an insulating film;
a wiring provided on a first surface of the insulating film;
a semiconductor element provided on the wiring; and
a heat dissipating member provided on a second surface of the insulating film which second surface is opposite to the first surface, wherein the heat dissipating member comprises a first heat dissipating member, and the first heat dissipating member comprises at least one slit;
the at least one slit is provided in the first heat dissipating member along a center line of the semiconductor element; and
the at least one slit comprises at least one second slit provided in a region of the first heat dissipating member which region corresponds to an edge of the semiconductor element and a vicinity of the edge, said at least one second slit forming a radius of a sector of a circle, wherein a tip of a wedge angle of the sector is located along a center line of the first heat dissipating member.

2. The semiconductor device as set forth in claim 1, wherein:
said at least one slit includes one or more first slits each of which is parallel to a side of the semiconductor element.

3. The semiconductor device as set forth in claim 2, wherein:
said at least one slit includes a fourth slit in which at least one first slit section and at least one second slit section are combined and joined together, said at least one first slit section being one of the one or more first slits parallel to a side of the semiconductor element in one direction, and said at least one second slit section being another one of the one or more first slits parallel to a side of the semiconductor element in the other direction.

4. The semiconductor device as set forth in claim 2, wherein:
said at least one slit includes at least two sixth slits disposed at a distance from each other, each of said at least two sixth slits being formed by bending one of the one or more first slits so that the one of the one or more first slits has an L-shape constituted by a shorter part and a longer part, the shorter part being an end portion of the one of the one or more first slits; and
in a case where two of said at least two sixth slits, disposed at distance from each other, are grouped into one set, end portions of the two sixth slits in the one set are disposed so that (i) one end portion, which is a shorter part of an L-shape, of one of the two sixth slits is parallel to one end portion, which is a shorter part of an L-shape, of the other of the two sixth slits and (ii) the other end portion, which is a longer part of the L-shape, of the one of the two sixth slits is parallel to the other end portion, which is a longer part of the L-shape, of the other of the two sixth slits.

5. The semiconductor device as set forth in claim 2, wherein:
each of the one or more first slits is at a horizontal distance of 0.1 mm or more and not more than 2.0 mm from an end face of a bump provided for one side of the semiconductor element, said each of the one or more first slits being closer to the one side than any other side of the semiconductor element.

6. The semiconductor device as set forth in claim 1, wherein:
said at least one second slit is made of two slits which make a right angle with each other, each of the two slits being provided with an additional slit so as to form a third slit shaped in a square having an opening facing the edge of the first heat dissipating member.

7. The semiconductor device as set forth in claim 1, wherein:
said at least one slit includes a fifth slit disposed along a circumference of the semiconductor element.

8. The semiconductor device as set forth in claim 1, wherein:
said at least one slit is positioned in such a manner that slits are aligned with a space therebetween or a slit does not reach an edge of the first heat dissipating member in order that the first heat dissipating member is not divided.

9. The semiconductor device as set forth in claim 1, wherein:
said at least one slit is formed so as to be symmetric with respect to a center line of the semiconductor element.

10. The semiconductor device as set forth in claim 1, wherein:
said at least one slit has a large-width part in a region where the first heat dissipating member thermally expands to a large degree, and said at least one slit has a small-width part in a region where the first heat dissipating member thermally expands to a small degree.

11. The semiconductor device as set forth in claim 1, wherein:
the first heat dissipating member has a vertical width set so that the first heat dissipating member is positioned on an inner side of a punched-out region of the semiconductor device, and at a distance of at least 0.5 mm from each of both vertical edges of the punched-out region.

12. The semiconductor device as set forth in claim 1, wherein:
the first heat dissipating member is provided only in a region of the second surface of the insulating film which region corresponds to the semiconductor element and the surrounding of the semiconductor element.

13. The semiconductor device as set forth in claim 12, wherein:
a second heat dissipating member is further provided in a surrounding of the first heat dissipating member so as to be in contact with the first heat dissipating member;
the second heat dissipating member has a plurality of openings, each shaped in a square or a circle, each of which is a hole penetrating through the second heat dissipating member to the insulating film; and
the plurality of openings are arranged in rows and columns, while each of the plurality of openings keeps a certain distance from its adjacent opening of the plurality of openings.

14. The semiconductor device as set forth in claim 13, wherein:
in a case where the plurality of openings of the second heat dissipating member are each shaped in a square, one side of each of the plurality of openings is 50 μm or more and not more than 200 μm, and the plurality of openings are arranged so that each of the plurality of openings keeps a distance of 50 μm or more and not more than 200 μm from its adjacent opening of the plurality of openings; and in a case where the plurality of openings of the second heat dissipating member are each shaped in a circle, a diameter of each of the plurality of openings is 50 μm or more and not more than 200 μm, and the plurality of openings are arranged so that each of the plurality of openings keeps a distance of 50 μm or more and not more than 200 μm from its adjacent opening of the plurality of openings.

15. The semiconductor device as set forth in claim 14, wherein:

in the case where the plurality of openings of the second heat dissipating member are each shaped in a square, the plurality of openings are arranged so that one side of each of the plurality of openings is parallel to a line making an angle of 35° or more and not more than 55° with respect to a lateral side of the second heat dissipating member; and in the case where the plurality of openings of the second heat dissipating member are each shaped in a circle, the plurality of openings are arranged in respective positions corresponding to positions at which, in the case where the plurality of openings of the second heat dissipating member are each shaped in a square, the plurality of openings each shaped in a square are to be provided.

16. The semiconductor device as set forth in claim 13, further comprising:

a resist provided so as to cover a part of the insulating film and a part of the wiring, the second heat dissipating member having a lateral width which is equal to a lateral width of the first heat dissipating member, and the second heat dissipating member being positioned so that each of its vertical edges is on an inner side of, and at a distance of at least 0.5 mm from a corresponding one of positions on the second surface of the insulating film, the positions respectively corresponding to edges of the resist.

17. The semiconductor device as set forth in claim 12, further comprising:

a bending inhibited region where bending of the semiconductor device is inhibited while the semiconductor device is bent for use, the first heat dissipating member having a vertical width within a range from a length shorter by 0.5 mm than a vertical width of the bending inhibited region to a length longer by 0.5 mm than the vertical width of the bending inhibited region.

18. The semiconductor device as set forth in claim 17, wherein:

the first heat dissipating member has a lateral width set so that the first heat dissipating member is at a distance of at least 0.5 mm from each of both lateral edges of a punched-out region of the semiconductor device.

19. The semiconductor device as set forth in claim 1, wherein:

the first heat dissipating member or the heat dissipating member is made of a material having a thermal conductivity of 10 W/(m·K) or more.

20. The semiconductor device as set forth in claim 1, wherein:

the first heat dissipating member or the heat dissipating member is made of copper, aluminum, or SUS.

21. The semiconductor device as set forth in claim 1, wherein:

the first heat dissipating member or the heat dissipating member has a thickness of 5 μm or more and not more than 30 μm.

22. The semiconductor device as set forth in claim 1, wherein:

the first heat dissipating member or the heat dissipating member has a surface plated or coated with a material different from a material from which the first heat dissipating member or the heat dissipating member is made.

23. The semiconductor device as set forth in claim 1, wherein:

said at least one slit provided in the first heat dissipating member has a width of 0.02 mm or more and not more than 1.0 mm.

24. The semiconductor device as set forth in claim 1, wherein:

the semiconductor element is at a perpendicular distance of not more than 0.1 mm from the first heat dissipating member or the heat dissipating member.

25. A display apparatus comprising a semiconductor device as set forth in claim 1, the semiconductor device serving as a display apparatus driving module for driving the display apparatus.

* * * * *